(12) United States Patent
Kojima et al.

(10) Patent No.: US 6,614,096 B2
(45) Date of Patent: Sep. 2, 2003

(54) METHOD FOR MANUFACTURING A SEMICONDUCTOR DEVICE AND A SEMICONDUCTOR DEVICE

(75) Inventors: Akihiro Kojima, Yokohama (JP); Hideshi Miyajima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/126,591

(22) Filed: Apr. 22, 2002

(65) Prior Publication Data

US 2003/0001278 A1 Jan. 2, 2003

(30) Foreign Application Priority Data

Jun. 29, 2001 (JP) ......................................... 2001-200214

(51) Int. Cl.[7] .............................................. H01L 23/58
(52) U.S. Cl. ........................ 257/635; 257/637; 257/758; 257/750
(58) Field of Search ................................. 257/758, 635, 257/637, 750

(56) References Cited

U.S. PATENT DOCUMENTS 6,303,523 B2 * 10/2001 Cheung et al.
6,333,255 B1 * 12/2001 Sekiguchi
6,348,725 B2 * 2/2002 Cheung et al.

* cited by examiner

*Primary Examiner*—Sheila V. Clark
(74) *Attorney, Agent, or Firm*—Oblon, Spivak, McClelland, Maier & Neustadt, P.C.

(57) ABSTRACT

Disclosed is a method for manufacturing a semiconductor device, which comprises the steps of forming a first insulating film made of a low dielectric constant material and containing carbon, subjecting the first insulating film to a surface treatment to reduce the carbon concentration of surface layer of the first insulating film, thus turning the surface layer into a low carbon concentration layer, forming a second insulating film on the low carbon concentration layer, forming a groove in the first and second insulating films for burying a metal therein, burying the metal in the groove formed in the first and second insulating films, and polishing a surface of the metal buried in the groove to thereby form a metal wiring.

8 Claims, 4 Drawing Sheets

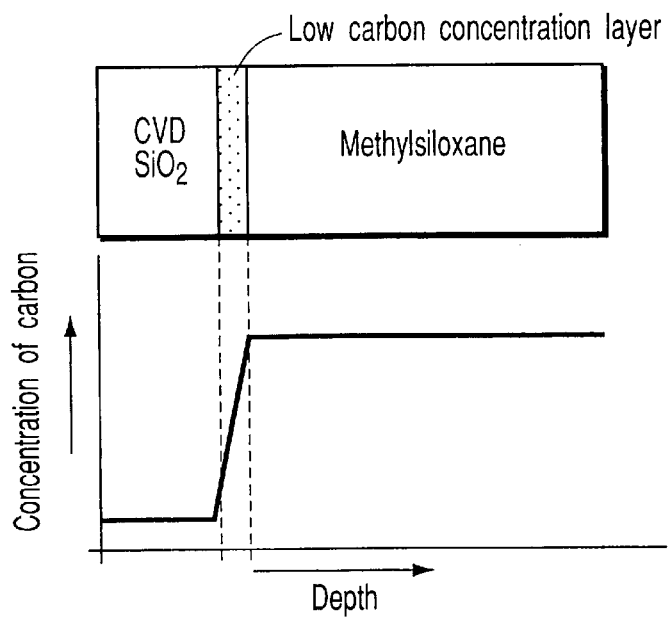
F I G. 4
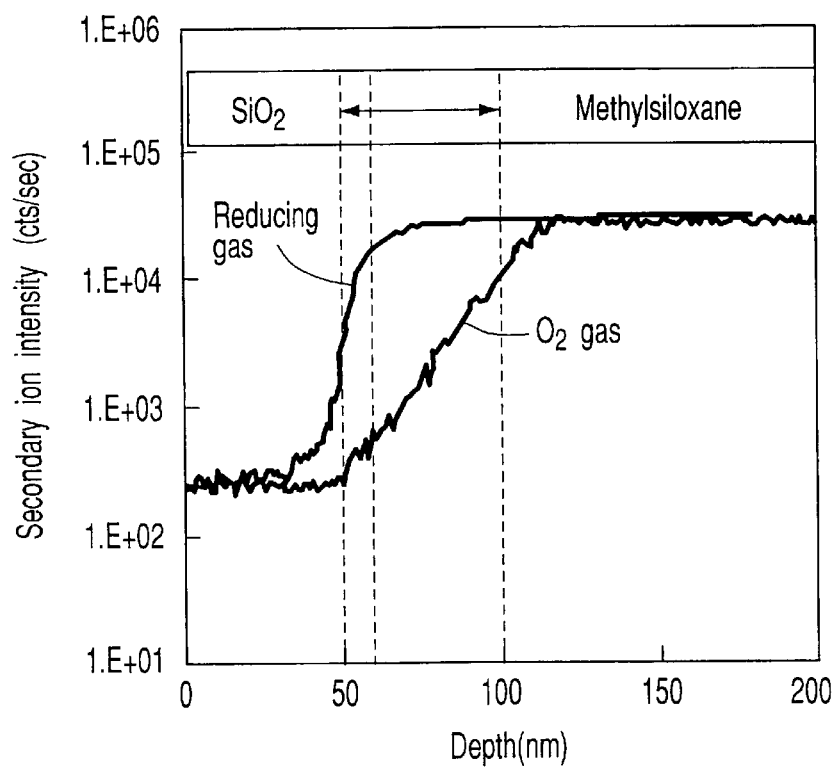
F I G. 5

METHOD FOR MANUFACTURING A SEMICONDUCTOR DEVICE AND A SEMICONDUCTOR DEVICE

CROSS-REFERENCE TO RELATED APPLICATIONS

This application is based upon and claims the benefit of priority from the prior Japanese Patent Application No. 2001-200214, filed Jun. 29, 2001, the entire contents of which are incorporated by reference.

BACKGROUND OF THE INVENTION

1. Field of the Invention

This invention relates to a method of manufacturing a semiconductor device and also to a semiconductor device. In particular, this invention is related to a semiconductor device comprising a multi-layer wiring of damascene wiring structure wherein a low dielectric constant insulating film is employed as an interlayer material. This invention also relates to a method for manufacturing such a semiconductor device.

2. Description of the Related Art

As the density of ULSIs has been increasingly enhanced in recent years, the problem of retardation in propagation of wiring is now increasingly serious. It is known, as a method for solving this problem, to lower the dielectric constant of interlayer insulating film or to minimize the electric resistance of wiring material. The lowering of dielectric constant of interlayer insulating film can be realized by using an interlayer insulating film material having a low dielectric constant, i.e. as low as not more than 3.0 in relative dielectric constant. For example, the use of polysiloxane film is effective in this respect. As for minimizing the electric resistance of wiring material, the use of copper wiring is well known.

Even though the use of copper wiring is advantageous in minimizing the electric resistance of wiring, it is very difficult to perform the fine working on copper wiring, so that a damascene process is generally employed for forming a multi-layer wiring structure by using copper wiring. According to the damascene process, an interlayer insulating film is formed at first, and then, a groove having the same width as that of the wiring desired to be obtained is formed. Thereafter, the groove is filled with a wiring material, and then, any redundant metal is removed from the surface of the interlayer insulating film by a CMP (Chemical Mechanical Polishing) method to form a multi-layer wiring structure.

In a case where polysiloxane such as methylpolysiloxane is employed as an interlayer insulating film, a silicon oxide film 16 may be laminated on a methylpolysiloxane film 15 by a CVD (Chemical Vapor Deposition) process as shown in FIG. 1A in order to enhance the dry etching (plasma) resistance or the CMP resistance thereof. As shown in FIG. 1A, the methylpolysiloxane film 15 is formed over the surface of a semiconductor substrate 12, on which an insulating film 10, an additional insulating film 9 where a lower layer wiring 11 is buried therein through a barrier metal layer 8, and a silicon nitride film 14 have been successively deposited in advance. The interlayer insulating film constituted by this laminate structure is provided, as shown in FIG. 1B, with an upper wiring 19 which has been formed by a process wherein a contact hole 13 and a wiring groove 17 are formed in the interlayer insulating film, and then, a barrier metal 18 and a metal constituting a wiring material are buried in these hole and groove, which is followed by a CMP treatment to form the upper wiring 19. However, there is a high possibility that the silicon oxide film 16 formed by the CVD method is peeled away (as indicated by 20) during the processes such as the CMP working and heat treatments, thereby degrading the reliability of the semiconductor device.

As described above, it is now desired, in the manufacture of a semiconductor device which is capable of lowering the dielectric constant of the interlayer insulating film and of minimizing the electric resistance of wiring material, to take some measures to prevent the interlayer insulating film from being peeled away.

BRIEF SUMMARY OF THE INVENTION

A method for manufacturing a semiconductor device according to one embodiment of the present invention comprises:

forming a first insulating film above a semiconductor substrate, the first insulating film being made of a low dielectric constant material and containing carbon;

subjecting the first insulating film to a surface treatment to reduce the carbon concentration of a surface layer of the first insulating film, thus turning the surface layer into a low carbon concentration layer;

forming a second insulating film on the low carbon concentration layer;

forming a groove in the first and second insulating films for burying a metal therein;

burying the metal in the groove formed in the first and second insulating films; and polishing a surface of the metal buried in the groove to form a metal wiring.

A semiconductor device according to another embodiment of the present invention comprises:

a semiconductor substrate;

an interlayer insulating film formed above the semiconductor substrate, the interlayer insulating film containing a first insulating film comprising carbon and made of a low dielectric constant material and a second insulating film formed on the first insulating film; and a damascene wiring structure formed in the interlayer insulating film;

wherein the first insulating film is provided, on one surface thereof facing the second insulating film, with a low carbon concentration layer where the concentration of carbon is minimized.

BRIEF DESCRIPTION OF THE SEVERAL VIEWS OF THE DRAWING

FIG. 4 is a graph illustrating a profile of carbon concentration at an interface between a methyl-containing polysiloxane film and a CVD silicon oxide film which are formed by a method according to one embodiment of the present invention; and FIG. 5 is a graph illustrating a profile of carbon concentration at an interface between a methyl-containing polysiloxane film and a CVD silicon oxide film.

DETAILED DESCRIPTION OF THE INVENTION

One embodiment according to the present invention will be explained in detail in reference to the drawings as follows.

As a result of intensive studies made by the present inventors on the phenomenon of peeling at the interface between a methylpolysiloxane film and a CVD silicon oxide film in the prior art, the present inventors have succeeded to find out the following facts. Namely, it has been found that the peeling of the CVD silicon oxide film can be attributed to a low adhesion between the CVD silicon oxide film and the methylpolysiloxane film, which is caused to occur due to the carbon atoms of the methyl group (—$CH_3$) existing inside the methylpolysiloxane film.

Figure 1A:
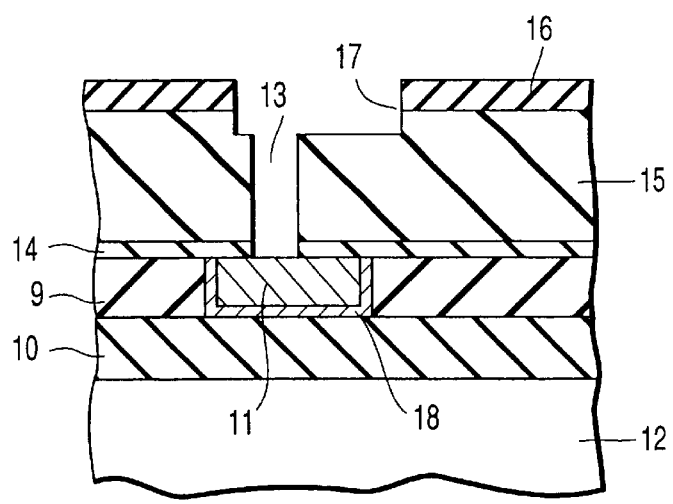
FIGS. 1A and 1B respectively represents a cross-sectional view illustrating steps of manufacturing a semiconductor device according to the prior art.
Figure 1B:
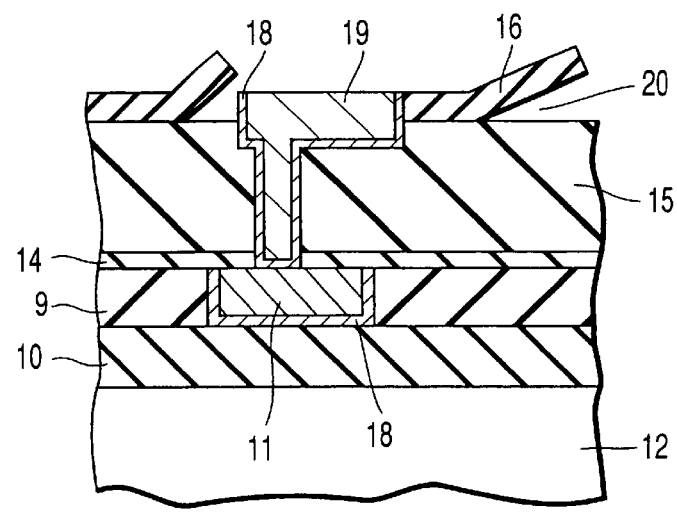
Figure 2:
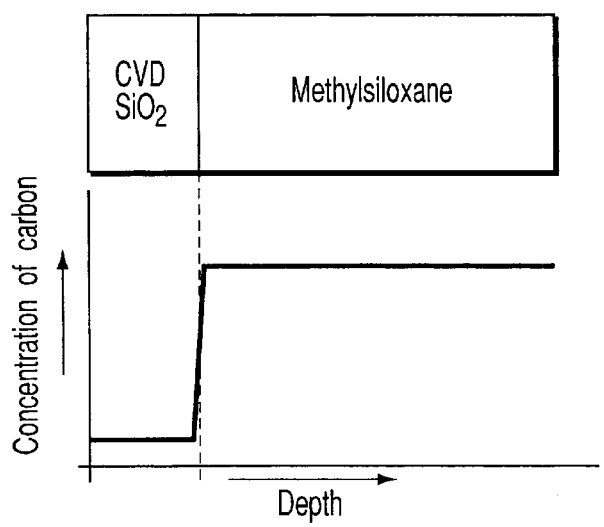
FIG. 2 is a graph illustrating a profile of carbon concentration at an interface between a methylpolysiloxane film and a CVD silicon oxide film which are formed by a conventional method.

In this regard, FIG. 2 shows a depth profile (SIMS analysis) of the interface between the methylpolysiloxane film 15 and the CVD silicon oxide film 16 under the conditions shown in FIG. 1A. As shown in FIG. 2, the concentration of carbon changed sharply at the interface between the methylpolysiloxane film and the CVD silicon oxide film. According to the studies made by the present inventors, although the surface of the CVD silicon oxide film was hydrophilic, the surface of the CVD silicon oxide film was gradually turned into hydrophobic as the concentration of carbon in the CVD silicon oxide film increased. Namely, the sharp change in concentration of carbon at the interface between the methylpolysiloxane film and the CVD silicon oxide film was found as being the main reason for the peeling of the CVD silicon oxide film.

The present inventors have found that the control of the profile in concentration of carbon in a manner to avoid a sharp change in concentration of carbon at the interface between the methyl-containing polysiloxane film such as a methylpolysiloxane film and the CVD silicon oxide film is effective in preventing the peeling of the CVD silicon oxide film. Based on these findings, a method has been found wherein prior to the deposition of a second film such as the CVD silicon oxide film, the concentration of carbon in the surface layer of a first insulating film such as the methyl-containing polysiloxane film is lowered, thereby turning the surface layer into a low carbon concentration layer.

FIGS. 3A to 3E show the steps of manufacturing a multi-layer wiring structure, wherein an interlayer insulating film having a laminate structure comprising the methyl-containing polysiloxane film employed as the first insulating film of low dielectric constant and containing carbon, and the CVD silicon oxide film employed as the second insulating film was formed at first according to one embodiment of the present invention, and then, wiring and via-plugs were buried in the interlayer insulating film to obtain the multi-layer wiring structure.

Figure 3A:
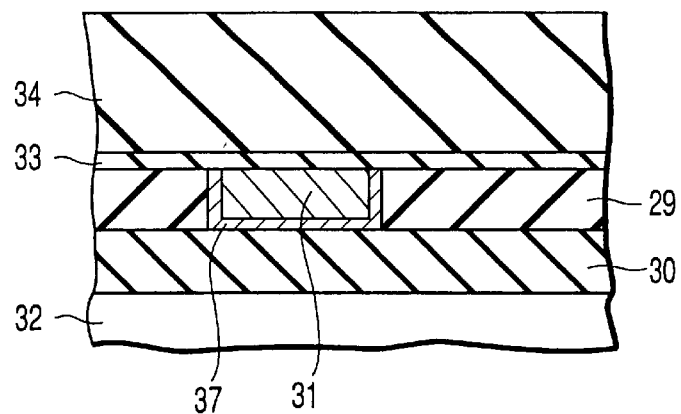
FIGS. 3A to 3E respectively represents a cross-sectional view illustrating steps of manufacturing a semiconductor device according to one embodiment of the present invention.

First of all, as shown in FIG. 3A, an insulating film 30 and an insulating film 29 having a lower wiring 31 (made of Cu) buried therein through a barrier metal layer 37 were successively formed in advance on the surface of a semiconductor substrate 32, on which a silicon nitride film 33 was subsequently formed. This silicon nitride film 33 was formed by a plasma CVD method to prevent the Cu of the wiring material from diffusing into the laminate film.

On this silicon nitride film 33, a methyl-containing polysiloxane film 34 functioning as the first insulating film containing carbon and exhibiting a low dielectric constant was formed according to the following procedures. Namely, first of all, while allowing a stage which was controlled at room temperature to rotate at a speed of 2500 rpm, a solution of methylsiloxane was coated on the silicon nitride film 33 and heated at a temperature of 80° C. for one minute in air atmosphere. Additionally, the coated methylsiloxane layer was heated at a temperature of 200° C. for one minute in air atmosphere, thereby allowing a solvent such as PGPE (propylene glycol monopropyl ether) to evaporate. Thereafter, the resultant layer was subjected to a dehydro-condensation at a temperature of 400° C. in an $N_2$ atmosphere for 30 minutes to obtain the methyl-containing polysiloxane film 34 having a film thickness of about 500 nm.

Figure 3B:
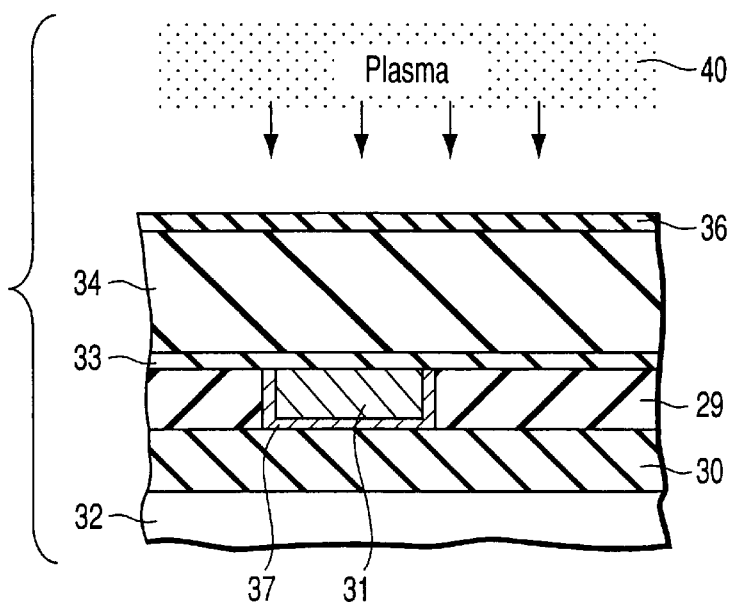

In this example, the methyl-containing polysiloxane film was subjected to a-surface treatment before the silicon oxide film constituting the second insulating film was deposited on the methyl-containing polysiloxane film 34 by a CVD method, thereby lowering the concentration of carbon in the surface layer of the methyl-containing polysiloxane film 34. In this case, a plasma treatment was performed by using a reducing gas to form a low carbon concentration layer 36 as shown in FIG. 3B.

In this plasma treatment, the semiconductor substrate 32 having the methyl-containing polysiloxane film 34 formed thereon was placed in a vacuumized vessel and mounted on a sample table which was designed to be impressed with a high-frequency power of 13.56 MHz. Thereafter, the semiconductor substrate 32 was maintained at a temperature ranging from 20° C. to 25° C. by a cooling mechanism mounted on the sample table. Then, while a $H_2$ gas diluted with $N_2$ to 3% in concentration was kept being introduced into the vessel at a flow rate of 150 sccm, a high-frequency power of 550 W was applied to the vessel with the pressure inside the vessel being maintained at 150 mTorr, thereby performing the surface treatment of the methyl-containing polysiloxane film 34 with a plasma 40 for 60 seconds.

The ion energy (Vdc) on this occasion was about 120 V.

Figure 3C:
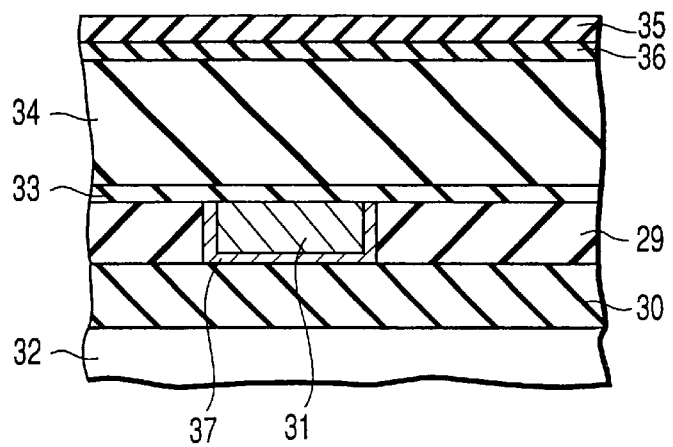

Upon finishing the surface treatment of the methyl-containing polysiloxane film 34, a CVD silicon oxide film 35 employed as the second insulating film was deposited on the methyl-containing polysiloxane film 34 as shown in FIG. 3C, and the state of the resultant interface was observed. FIG. 4 shows a depth profile (SIMS analysis) of the interface between the methyl-containing polysiloxane film 34 and the CVD silicon oxide film 35. As clearly seen from FIG. 4, the methyl-containing polysiloxane film 34 employed as the first insulating film of low dielectric constant and containing carbon was found modified in such a manner that the surface thereof facing the CVD silicon oxide film 35 constituting the second insulating film had a decreased concentration of carbon, thereby forming a low carbon concentration layer. Further, the thickness of this low carbon concentration layer was about 10 nm. The carbon concentration at an interface between the low carbon concentration layer and the CVD silicon oxide film 35 was about ⅕ as compared with the carbon concentration inside the methyl-containing polysiloxane film 34. In order to enable the effects of the low carbon concentration layer to sufficiently exhibit so as to prevent the peeling of the CVD silicon oxide film 35 constituting the second insulating film, the concentration of carbon at the surface of the low carbon concentration layer should preferably be controlled to not more than ⅕ of that of the regions of the first insulating film where the concentration of carbon is not reduced at all.

Figure 3D:
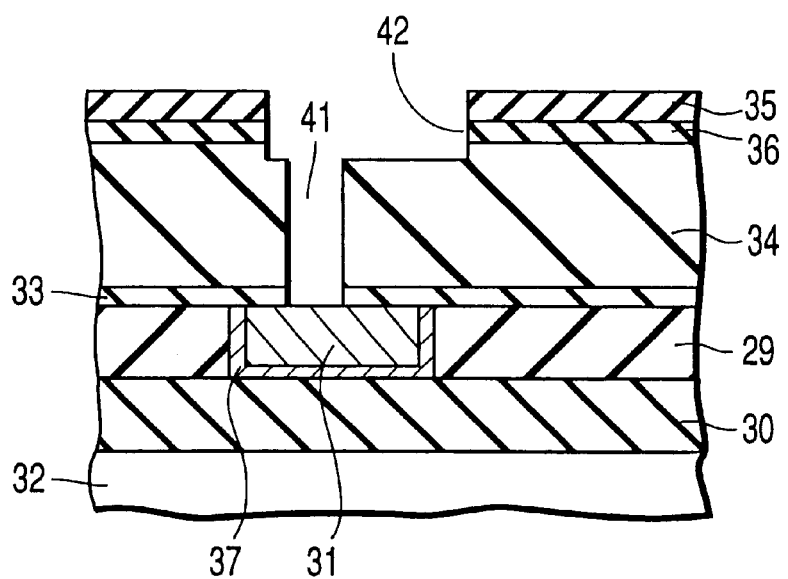

Next, as shown in FIG. 3D, a contact hole (via-hole) 41 and a wiring groove 42 were formed in the insulating film comprising the methyl-containing polysiloxane film 34, the low carbon concentration layer 36 and the CVD silicon oxide film 35. On the occasion of forming the contact hole 41, a resist pattern (not shown) was formed at first on the surface of the CVD silicon oxide film 35. Then, by using this resist pattern as a mask, the contact hole 41 was formed in the insulating film by a reactive ion etching (RIE) method using a mixed gas comprising $C_4F_8/CO/Ar/O_2$. The etching rate of the silicon nitride film relative to the silicon oxide film on this occasion was within the range of 10 to 15.

The resist pattern employed as a mask could be peeled away by an oxygen plasma treatment performed in an ashing device under the conditions of: 150 sccm oxygen flow rate, 0.15 Torr discharge pressure, and 25° C. substrate temperature.

In the same manner as in the case of the contact hole 41, the upper wiring groove 42 was also formed by an RIE method using a resist pattern (not shown) as a mask. After peeling the resist pattern, the silicon nitride film 33 deposited on the wiring 31 was worked by an RIE method, thereby performing a working corresponding to a dual damascene.

Figure 3E:
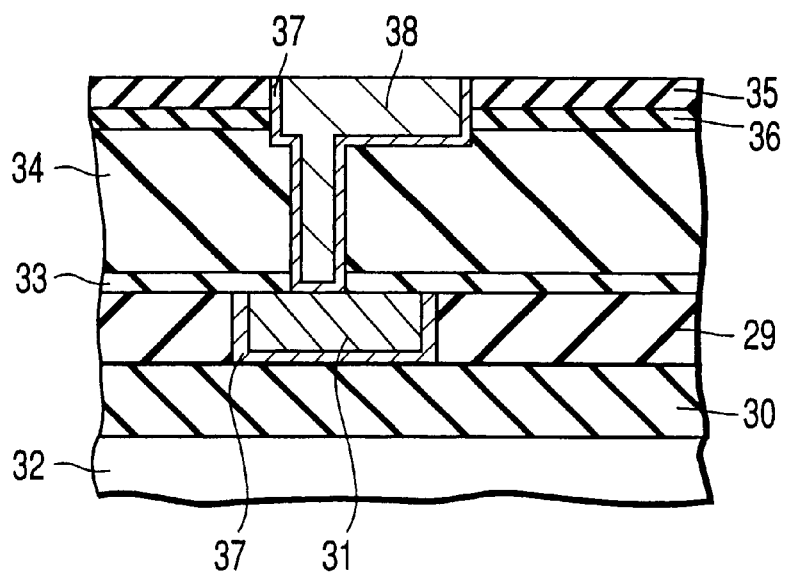

Inside the contact hole 41 and the upper wiring groove 42 thus formed, there were formed a barrier metal 37 composed of TaN/Ta by a sputtering method for preventing Cu employed as a wiring material from diffusing into the interlayer insulating film, and a buried wiring 38 composed of Cu by a plating method. Thereafter, a redundant portion of metal was removed by a CMP method, thereby obtaining a multi-layer wiring structure as shown in FIG. 3E.

In this example, the low carbon concentration layer 36 which was formed through the lowering of carbon concentration in the surface layer of the methyl-containing polysiloxane film 34 was formed between the methyl-containing polysiloxane film 34 constituting the first insulating film and the CVD silicon oxide film 35. Since the changes in concentration of carbon between the methyl-containing polysiloxane film 34 and the CVD silicon oxide film 35 can be alleviated due to the presence of this low carbon concentration layer 36, it was possible to avoid such a sharp change as seen in the prior art, thereby making it possible to prevent the peeling of the CVD silicon oxide film 35.

In the foregoing example, the plasma treatment was performed using, as a reducing gas, an $H_2$ gas which was diluted with $N_2$ to 3%. However, the reducing gas is not limited to such an $H_2$ gas. Namely, the plasma treatment can be performed using at least one kind of reducing gas selected from the group consisting of $H_2$, $N_2$, CO, $CO_2$ and $NH_3$, thereby making it possible to lower the concentration of carbon at the surface layer of the first insulating film, thus forming the low carbon concentration layer. Irrespective of the kind of these reducing gases in the formation of the low carbon concentration layer, almost the same effects can be obtained, i.e. the peeling of the CVD silicon oxide film from the methyl-containing polysiloxane film can be prevented in the following dual damascene process to be successively performed.

In order to enable the effects of the low carbon concentration layer to sufficiently exhibit however, the thickness of this low carbon concentration layer should preferably be not less than 10 nm. On the other hand, in order to avoid the effects of the methyl-containing polysiloxane film, or the advantages of low dielectric constant thereof, from being hindered, the thickness of the low carbon concentration layer should preferably be confined to not more than 10% of the entire thickness of the methyl-containing polysiloxane film constituting the first insulating film, more specifically not more than 100 nm.

It should be noted that, when a plasma treatment is applied to the methyl-containing polysiloxane film constituting the first insulating film by using an oxidizing gas (for example, $O_2$ gas), it would become difficult to limit the thickness of the low carbon concentration layer to a desirable range shown in FIG. 5. Whereas, it has been first found out by the present inventors that the low carbon concentration layer having desirable features can be obtained by performing the plasma treatment using a reducing gas.

The present invention can be variously modified within the spirit thereof.

As for the first insulating film which contains carbon and is composed of a low dielectric constant material, a material having a relative dielectric constant of not more than 3.0 can be employed. In terms of low dielectric constant, the employment of a film having a siloxane skeleton is preferable. It is more preferable to employ a film comprising, as a main component, polysiloxane containing a methyl group. Since an insulating film comprising, as a main component, methyl-containing polysiloxane is provided with spaces inside the molecular structure thereof due to the presence of the methyl group, the insulating film would become porous in general. This first insulating film may be formed by a CVD method. For example, a methyl-containing polysiloxane film constituting the first insulating film can be formed by using of an anode coupling parallel plate type CVD apparatus under the following film-forming conditions. The film formed in this manner by a CVD method is referred to as a carbon-containing $SiO_2$ film.

Pressure: 4.0 Torr

RF power: 600 W

Temperature of substrate: 350° C.

Oxygen: 100 sccm

Trimethyl silane: 600 sccm

Film-forming speed: 500 nm/min

Further, as for the first insulating film containing carbon and exhibiting a low dielectric constant, it is also possible to employ an insulating film having no siloxane skeleton. For example, it is possible to employ a polymer film or an amorphous carbon film (F-dope), each film having a relative dielectric constant of not more than 3.0. It is possible, even with the employment of these materials as the first insulating film, to obtain almost the same effects as described above by performing the same surface treatment as mentioned above.

Further, on the occasion of forming the low carbon concentration layer through the lowering of the carbon concentration in the surface layer of the first insulating film, the surface may be subjected to a wet treatment using an oxidizing solution. Specifically, the surface of the first insulating film such as a methyl-containing polysiloxane film can be treated with an $H_2O_2$ solution or a ($H_2O_2$+ $H_2SO_4$) solution, thereby making it possible to lower the concentration of carbon. However, in order to confine the thickness of the low carbon concentration layer to 100 nm or less, it is preferable to perform a plasma treatment using a reducing gas as described above.

The second insulating film to be formed on the surface of the low carbon concentration layer which can be obtained through the aforementioned surface treatment may be an insulating film containing at least one kind of material selected from the group consisting of SiO, SiOP, SiOF, SiON, SiC, SiOC and SiOCH. For example, the second insulating film may be an SiO$_2$ film. It is preferable to employ a low dielectric constant insulating film to suppress increasing the dielectric constant of the whole insulating film.

It is possible, on the occasion of forming the first and second insulating films according to one embodiment of the present invention, to optionally combine a coating method with a CVD method. As already explained above, the surface treatment for forming a low dielectric constant insulating film through the lowering of the concentration of carbon in the surface layer of the first insulating film should preferably be performed by a plasma treatment using a reducing gas in view of controlling the thickness of the low dielectric constant insulating film. Therefore, where the second insulating film is to be formed by a CVD method, the surface treatment of the first insulating film and the formation of the second insulating film can be performed in the same chamber, which is advantageous in terms of processing.

As explained above, according to one embodiment of the present invention, there is provided a method of manufacturing a semiconductor device excellent in reliability by using a low dielectric constant insulating film and by a damascene method. Further, according to another embodiment of the present invention, there is also provided a semiconductor device excellent in reliability and having a damascene wiring structure comprising a low dielectric constant insulating film.

Therefore, the present invention can be effectively utilized in the manufacture of a multi-layer wiring structure, in particular, in the manufacture of a semiconductor device having a damascene wiring structure, and hence the present invention is very valuable in industrial viewpoint.

Additional advantages and modifications will readily occur to those skilled in the art. Therefore, the invention is its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a semiconductor substrate;

an interlayer insulating film formed above said semiconductor substrate, said interlayer insulating film comprising a first insulating film comprising carbon and made of a low dielectric constant material and a second insulating film formed on said first insulating film; and a damascene wiring structure formed in said interlayer insulating film;

wherein said first insulating film comprises a region facing said second insulating film, treated to remove carbon atoms so as to have a carbon concentration lower than that of a remainder of said first insulating film.

2. The semiconductor device according to claim 1, wherein a thickness of said region of said first insulating film is 10 nm or more, and is not larger than 10% based on a thickness of said first insulating film.

3. The semiconductor device according to claim 1, wherein a thickness of said region of said first insulating film is withing a range of 10 nm to 100 nm.

4. The semiconductor device according to claim 1, wherein a carbon concentration at an interface between said region of said first insulating film and said second insulating film is ⅕ or less as compared with a carbon concentration inside said first insulating film excluding said region.

5. The semiconductor device according to claim 1, wherein said first insulating film is a film having a siloxane skeleton.

6. The semiconductor device according to claim 1, wherein said first insulating film is a polymer film or an amorphous carbon film, each film having a relative dielectric constant of not more than 3.0.

7. The semiconductor device according to claim 1, wherein said second insulating film comprises at least one kind of material selected from the group consisting of SiO, SiOP, SiOF, SiON, SiC, SiOC and SIOCH.

8. The semiconductor device according to claim 5, wherein said first insulating film comprises methyl-containing polysiloxane as a main component.

* * * * *